(12) United States Patent
Fukasawa

(10) Patent No.: US 6,941,534 B2
(45) Date of Patent: Sep. 6, 2005

(54) SEMICONDUCTOR DEVICE AND LAYOUT DATA GENERATION APPARATUS

(75) Inventor: Shinji Fukasawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 731 days.

(21) Appl. No.: 09/877,033

(22) Filed: Jun. 11, 2001

(65) Prior Publication Data

US 2002/0074571 A1 Jun. 20, 2002

(30) Foreign Application Priority Data

Dec. 20, 2000 (JP) ........................................ 2000-387264

(51) Int. Cl.[7] .............................................. G06F 17/50
(52) U.S. Cl. ........................................................ 716/8
(58) Field of Search .............................. 716/7, 8–10, 1, 716/12–14

(56) References Cited

U.S. PATENT DOCUMENTS

| 5,680,064 | A | * | 10/1997 | Masaki et al. | 326/81 |
|---|---|---|---|---|---|
| 6,163,170 | A | * | 12/2000 | Takinomi | 326/81 |
| 6,167,554 | A | * | 12/2000 | Ishikawa et al. | 716/1 |
| 6,232,818 | B1 | * | 5/2001 | Zaliznyak | 327/333 |
| 6,266,798 | B1 | * | 7/2001 | Kanazawa et al. | 716/4 |
| 6,288,591 | B1 | * | 9/2001 | Riccio | 327/333 |
| RE37,475 | E | * | 12/2001 | Ohara | 326/41 |
| 6,490,715 | B1 | * | 12/2002 | Moriwaki et al. | 716/17 |
| 6,629,300 | B1 | * | 9/2003 | Otake | 716/8 |
| 6,668,356 | B2 | * | 12/2003 | Linz | 716/1 |
| 6,721,933 | B2 | * | 4/2004 | Iwasa | 716/10 |
| 6,792,582 | B1 | * | 9/2004 | Cohn et al. | 716/7 |
| 2002/0002700 | A1 | * | 1/2002 | Inui et al. | 716/8 |

* cited by examiner

Primary Examiner—Stacy A. Whitmore
Assistant Examiner—Magid Y. Dimyan
(74) Attorney, Agent, or Firm—Arent Fox PLLC

(57) ABSTRACT

A semiconductor device that facilitates the layout designing of cells and power supply lines. The semiconductor device includes a first power supply line that corresponds to a first power supply voltage, a second power supply line that corresponds to a second power supply voltage, and a function block. A first standard cell is arranged in the function block and has a first power supply terminal connected to the first power supply line. A second standard cell has a second power supply terminal connected to the second power supply line. A level converter cell is aligned with the first and second standard cells and has a third power supply terminal connected to the first power supply line and a fourth power supply terminal connected to the second power supply line.

19 Claims, 9 Drawing Sheets

|  | Block A (1.0V) | Block B (1.2V) | Block C (1.2V) | Block D (0.8V) |
|---|---|---|---|---|
| Block A (1.0V) |  | Required | Required | Required |
| Block B (1.2V) | Required |  | Not Required | Required |
| Block C (1.2V) | Required | Not Required |  | Required |
| Block D (0.8V) | Required | Required | Required |  |

Fig.5
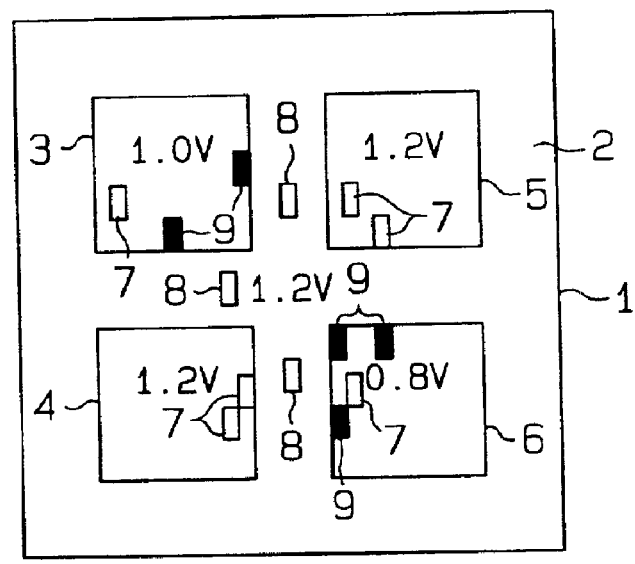
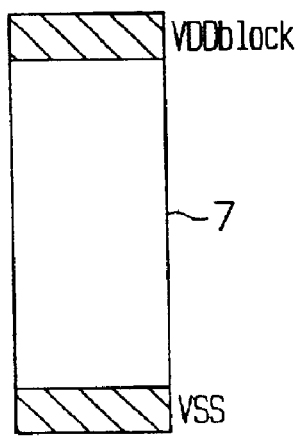
Fig.6A
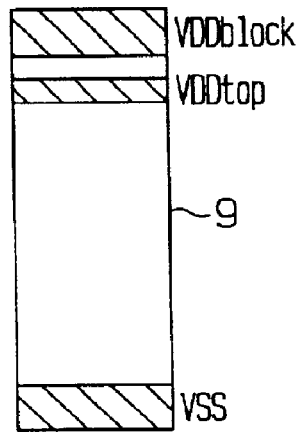
Fig.6B
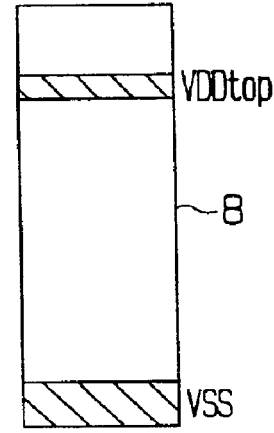
Fig.6C

US 6,941,534 B2

SEMICONDUCTOR DEVICE AND LAYOUT DATA GENERATION APPARATUS

BACKGROUND OF THE INVENTION

The present invention relates to a semiconductor device and a semiconductor designing apparatus, and more particularly, to a semiconductor device having a plurality of function blocks respectively corresponding to a plurality of power supply voltages and an apparatus for generating layout data of such semiconductor device.

A large-scale integration (LSI) circuit, such as an application-specific integrated circuit (ASIC), includes function blocks, level converters, and repeater cells. The function blocks are driven by different power supply voltages. The level converter cells and the repeater cells are arranged in a plurality of line nets in correspondence with the power supply voltages. There is a demand that the layout designing of the LSI, including the layout designing of the level converter cells, the repeater cells, and the wiring, be performed more efficiently and within a shorter period of time.

FIG. 1 is a schematic plan view showing a prior art semiconductor device 80. The semiconductor device 80 has a substrate 81 on which seven function blocks 82, 83, 84, 85, 86, 87, 88 are defined. When each of the function blocks 82–88 have a power supply voltage that differs from that of the other function blocks, a line net connected to the function block is provided with a level converter cell (not shown).

FIG. 2 is a table indicating the power supply voltages of the function blocks 82–85 and positions where the level converter cells are required. The power supply voltage of the function block 82 (block A), the function block 83 (block B), function block 84 (block C), and function block 84 (block D) are 1.0V, 1.2V, 1.2V, and 0.8V, respectively. Except for the line net connecting the function blocks 83, 84, a level converter cell is required in each of the line nets connecting two function blocks. For example, a level converter cell is required in the line net connecting blocks A and B.

FIG. 3 is a schematic view showing a prior art step-up voltage level converter cell 90. The step-up voltage level converter cell 90 is connected to a line net between the function block of a low power supply voltage and the function block of a high power supply voltage. The step-up voltage level converter cell 90 includes a low voltage cell 90a, which is connected to the low voltage function block, and a high voltage cell 90b, which is connected to the high voltage function block. The low voltage cell 90a includes power supply terminals VDDL, VSS, and the high voltage cell 90b includes power supply terminals VDDH, VSS. The step-up voltage level converter cell 90 increases the voltage provided to the power supply terminal VDDL of the low voltage cell 90a and outputs the increased voltage from the power supply terminal VDDH of the high voltage cell 90b. It is preferred that the low voltage and high voltage cells 90a, 90b be proximal to each other.

FIG. 4 is a schematic diagram showing a prior art semiconductor device having a plurality of function blocks 91, 92, 93, 94 and a plurality of step-up voltage level converter cells 95, 96, 97 arranged between the blocks. The power supply voltages of the function blocks 91–94 are 1.0V, 1.2V, 1.2V, and 0.8V, respectively.

The step-up voltage level converter cell 95 is arranged in a line net between the function blocks 91, 92. The step-up voltage level converter 95 includes a low voltage cell 95a and a high voltage cell 95b. The step-up voltage level converter cell 95 increases the voltage of the low voltage cell 95a from 1.0V to 1.2V and outputs the increased voltage from the high voltage cell 95b. A standard cell (repeater cell) 98 is arranged between the low voltage cell 95a and the function block 91, and a standard cell 99 is arranged between the high voltage cell 95b and the function block 92. The repeater cell 98 receives the power supply voltage of the function block 91 (1.0V) and provides the voltage to the low voltage cell 95a. The repeater cell 98 receives the output voltage of the high voltage cell 95b (1.2V) and provides the voltage to the function block 92.

The step-up voltage level converter cell 96 is connected to a line net between the function blocks 91, 93. The step-up voltage level converter cell 96 increases the voltage provided to its low voltage cell 96a from 1.0V to 1.2V and outputs the increased voltage from its high voltage cell 96b.

The step-up voltage level converter cell 97 is connected to a line net between the function blocks 91, 94. The step-up voltage level converter cell 97 increases the voltage provided to its low voltage cell 97a from 0.8V to 1.0V and outputs the increased voltage from its high voltage cell 97b. In this line net, a repeater cell 100 is arranged between the low voltage cell 97a and the function block 94, and a repeater cell 101 is arranged between the high voltage cell 97b and the function block 91. The repeater cell 100 provides the power supply voltage of the function block 94 (0.8V) to the low voltage cell 97a. The repeater cell 101 provides the output voltage of the high voltage cell 97b (1.0V) to the function block 91.

When designing the semiconductor device, it is preferred that power supply terminals receiving the same voltage be aligned with each other and be connected by a line having the same width.

However, referring to FIG. 3, the power supply terminal VDDL of the low voltage cell 90a is formed next to the power supply terminal VDDH of the high voltage cell 90b in the prior art step-up voltage level converter cell 90. Accordingly, in the semiconductor device of FIG. 4, the step-up voltage level converters 95–97 are separated into low voltage cells 95a, 96a, 97a and high voltage cells 95b, 96b, 97b. Further, among the low voltage cells 95a, 96a, 97a and the high voltage cells 95b, 96b, 97b, cells having the same power supply voltage are aligned with each other. The power supply voltage supplied by the repeater cell 99 (1.2V) differs from the power supply voltage supplied to the repeater cell 100 (0.8V). Thus, the repeater cells 99, 100 are not aligned with each other.

Accordingly, the designing of a multiple power supply semiconductor device is complicated due to the restrictions applied in relation with the power supply voltage of cells.

SUMMARY OF THE INVENTION

It is an object of the present invention to provide a semiconductor device that facilitates the layout designing of cells and power supply lines and to provide an apparatus that designs the layout of such semiconductor device.

To achieve the above object, the present invention provides a semiconductor device including a first power supply line that corresponds to a first power supply voltage and a second power supply line that corresponds to a second power supply voltage. The first power supply voltage differs from the second power supply voltage. The semiconductor device includes at least one function block. A first standard cell is arranged in the at least one function block and has a first power supply terminal connected to the first power supply line. A second standard cell has a second power supply terminal connected to the second power supply line. A level converter cell is aligned with the first and second standard cells and has a third power supply terminal connected to the first power supply line and a fourth power supply terminal connected to the second power supply line.

A further perspective of the present invention is a semiconductor device having a plurality of blocks including a first block and a second block. The semiconductor device further includes a plurality of first standard cells. At least one of the first standard cells is arranged in the first block and at least one of the first standard cells is arranged in the second block. Each of the first standard cells has a first power supply terminal. A second standard cell is arranged between the first and second blocks. The second standard cell has a second power supply terminal misaligned with the first power supply terminal. At least one level converter cell is aligned with the first and second standard cells and has a third power supply terminal aligned with the first power supply terminal and a fourth power supply terminal aligned with the second power supply terminal.

A further perspective of the present invention is a designing apparatus for generating layout data of a semiconductor device. The semiconductor device is provided with a plurality of blocks including a first block and a second block. A plurality of first standard cells are arranged in the first and second blocks. A second standard cell is arranged between the first and second blocks. The semiconductor device also includes at least one level converter cell. The plurality of first standard cells, the second standard cell, and the level converter cell each have an end, a first region separated from the end by a predetermined first distance, and a second region separated from the end by a predetermined second distance. Each of the first standard cells has a first power supply terminal formed in the first region. The second standard cell has a second power supply terminal formed in the second region. The at least one level converter cell has a third power supply terminal formed in the first region and a fourth power supply terminal formed in the second region. The designing apparatus includes a processor. The processor obtains netlist data of the semiconductor device, sets a power supply voltage of each of the blocks based on the netlist data, sets a voltage between the blocks based on the power supply voltage of each block, generates the level converter cell based on the voltage between the blocks, and arranges the level converter cell in one of locations in or between the blocks in accordance with the power supply voltage and the voltage between the blocks so as to align the level converter cell with the first and second standard cells.

A further perspective of the present invention is a computer readable storage medium storing a program for generating layout data of a semiconductor device having a plurality of blocks with a computer. The semiconductor device is provided with a plurality of blocks including a first block and a second block. A plurality of first standard cells are arranged in the first and second blocks. A second standard cell is arranged between the first and second blocks. The semiconductor device also includes at least one level converter cell. The plurality of first standard cells, the second standard cell, and the level converter cell each have an end, a first region separated from the end by a predetermined first distance, and a second region separated from the end by a predetermined second distance. Each of the first standard cells has a first power supply terminal formed in the first region. The second standard cell has a second power supply terminal formed in the second region, and the level converter cell has a third power supply terminal formed in the first region and a fourth power supply terminal formed in the second region. The program includes the steps of obtaining netlist data of the semiconductor device with the semiconductor device, setting a power supply voltage of each of the blocks based on the netlist data, setting a voltage between the blocks based on the power supply voltage of each block, generating the level converter cell based on the voltage between the blocks, and arranging the level converter cell in one of locations in or between the blocks in accordance with the power supply voltage and the voltage between the blocks so as to align the level converter cell with the first and second standard cells.

A further perspective of the present invention is a semiconductor device including a linear first power supply line for supplying a first power supply voltage, a linear second power supply line extending parallel to the first power supply line for supplying a second power supply voltage that differs from the first power supply voltage, a first block, a second block, and a plurality of first standard cells arranged in each of the first and second blocks. Each of the plurality of first standard cells has a predetermined shape and includes an end and a first power supply terminal formed at a location separated from the end by a predetermined first distance. The first power supply terminal is connected to the first power supply line. A second standard cell has substantially the same shape as the first standard cells and includes an end and a second power supply terminal formed at a location separated from the end by a predetermined second distance that differs from the first distance. The second power supply terminal is connected to the second power supply line. A level converter cell is aligned with the first and second standard cells. The level converter cell has substantially the same shape as the first and second standard cells and includes an end, a third power supply terminal formed at a location separated from the end by the first distance and connected to the first power supply line, and a fourth power supply terminal formed at a location separated from the end by the second distance and connected to the second power supply line.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 5 is a schematic plan view showing a semiconductor device according to a first embodiment of the present invention;

FIGS. 6A, 6B, and 6C are schematic diagrams showing the level converter cell of FIG. 5;

DETAILED DESCRIPTION OF THE PREFERRED EMBODIMENTS

Figures 1, 2:
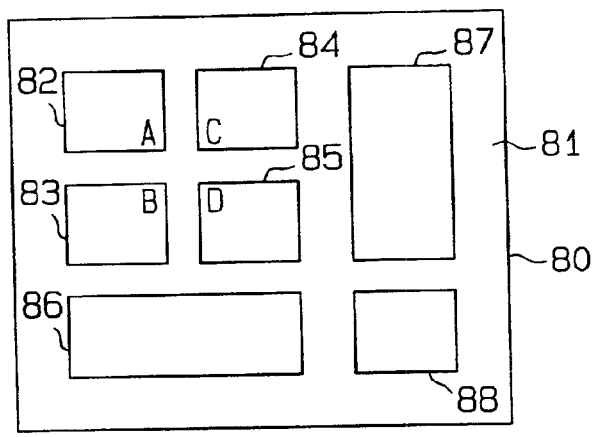
FIG. 1 is a schematic diagram showing a prior art semiconductor device.
FIG. 2 is a table showing power supply voltages of function blocks and positions that require a level converter.
Figure 3:
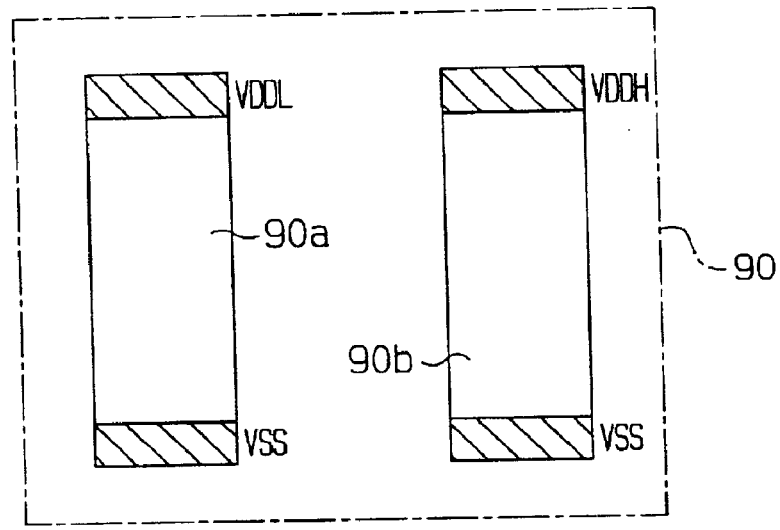
FIG. 3 is a schematic diagram showing a prior art step-up voltage level converter cell.
Figure 4:
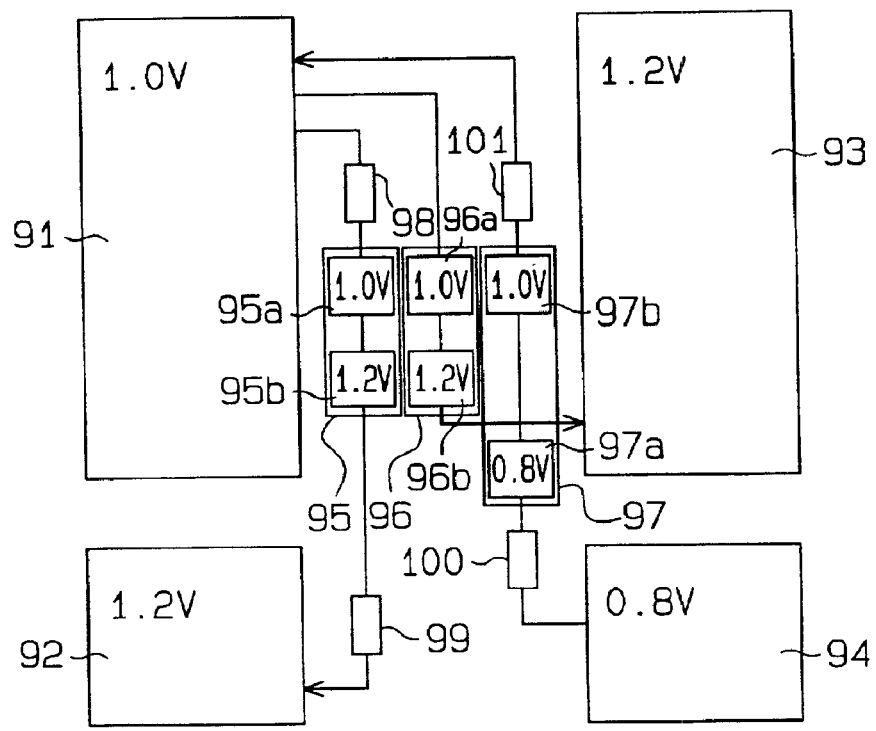
FIG. 4 is a schematic diagram showing the layout of a prior art semiconductor device.

A semiconductor device 1 according to a first embodiment of the present invention will now be discussed with reference to FIGS. 5 to 10.

With reference to FIG. 5, the semiconductor device 1 has a substrate 2 on which a plurality of (in FIG. 5, four) function blocks 3, 4, 5, 6 are arranged.

Each of the function blocks 3–6 includes at least one internal standard cell 7. The power supply voltage of the associated function block 3–6 is applied to each internal standard cell 7. The number and location of the internal standard cells 7 may be changed as required.

A plurality of (in FIG. 5, three) standard cells, or repeater cells 8, are arranged on the substrate between the function blocks 3 and 4, the function blocks 3 and 5, and the function blocks 4 and 6. The repeater cells 8 are supplied with the same power supply voltage of 1.2V. It is preferred that the power supply voltage of the repeater cells 8 be equal to the power supply voltage of the function blocks 3, 4, 5, 6 that is most used.

As shown in FIG. 5, level converter cells 9 are arranged in the function blocks 3, 6. The function blocks that are to be provided with the level converter cells 9 are determined in accordance with the power supply voltage of the selected repeater cells 8. More specifically, the level converter cells 9 are arranged in the function blocks 3, 6, which power supply voltages differ from that of the repeater cells 8. The number and location of the level converter cells 9 may be changed as required. It is most effective that the level converter cells 9 be arranged in the functional blocks 3, 6 and near the periphery of the functional blocks 3, 6. If the power supply voltages of adjacent function blocks are the same, the level converter cells 9 may be arranged between adjacent function blocks.

The power supply voltages of the function blocks 3, 4, 5, 6 are 1.0V, 1.2V, 1.2V, 0.8V, respectively, and the power supply voltage of each repeater cell 8 is 1.2V. In this case, the level converter cells 9 are arranged in the function block 3 near the periphery. Since the power supply voltages of the function blocks 4, 5 are both 1.2V, the level converter cells are not required in the function blocks 4, 5. The level converter cells 9 are also arranged in the function block 6 near the periphery. The layout of the level converter cells 9 in the function blocks 3, 6 provide the repeater cells 8 with a constant power supply voltage (1.2V).

FIGS. 6A, 6B, 6C are schematic diagrams of the internal standard cell 7, the level converter cell 9, and the repeater cell 8 shown in FIG. 5. It is preferred that the lengths of the internal standard cell 7, the level converter cell 9, and the repeater cell 8 be about the same.

In FIGS. 6A, 6B, 6C, power supply terminals VSS are formed on the lower ends of the internal standard cell 7, the level converter cell 9, and the repeater cell 8. A power supply terminal VDDblock is formed on the upper end of the internal standard cell 7. A power supply terminal VDDtop is formed on the repeater cell 8 at a location separated from the lower end of the repeater cell 8 by a predetermined distance. The distance between the power supply terminal VDDtop and the power supply terminal VSS in the repeater cell 8 differs from the distance between the power supply terminal VDDblock and the power supply terminal VSS in the internal standard cell 7.

A power supply terminal VDDblock is formed on the upper end of the level converter cell 9. A power supply terminal VDDtop is formed on the level converter cell 9 at a location separated from the lower end of the level converter cell 9 by a predetermined distance. The distance between the power supply terminal VDDblock and the power supply terminal VSS in the level converter cell 9 is substantially the same as the distance between the power supply terminal VDDblock and the power supply terminal VSS in the internal standard cell 7. The distance between the power supply terminal VDDtop and the power supply terminal VSS in the level converter cell 9 is substantially the same as the distance between the power supply terminal VDDtop and the power supply terminal VSS in the repeater cell 8. Accordingly, when the internal standard cell 7, the level converter cell 9, and the repeater cell 8 are arranged next to each other as shown in FIGS. 6A, 6B, 6C, the same type of the power supply voltages VSS, VDDtop, VDDblock are aligned with each other.

Figure 7:
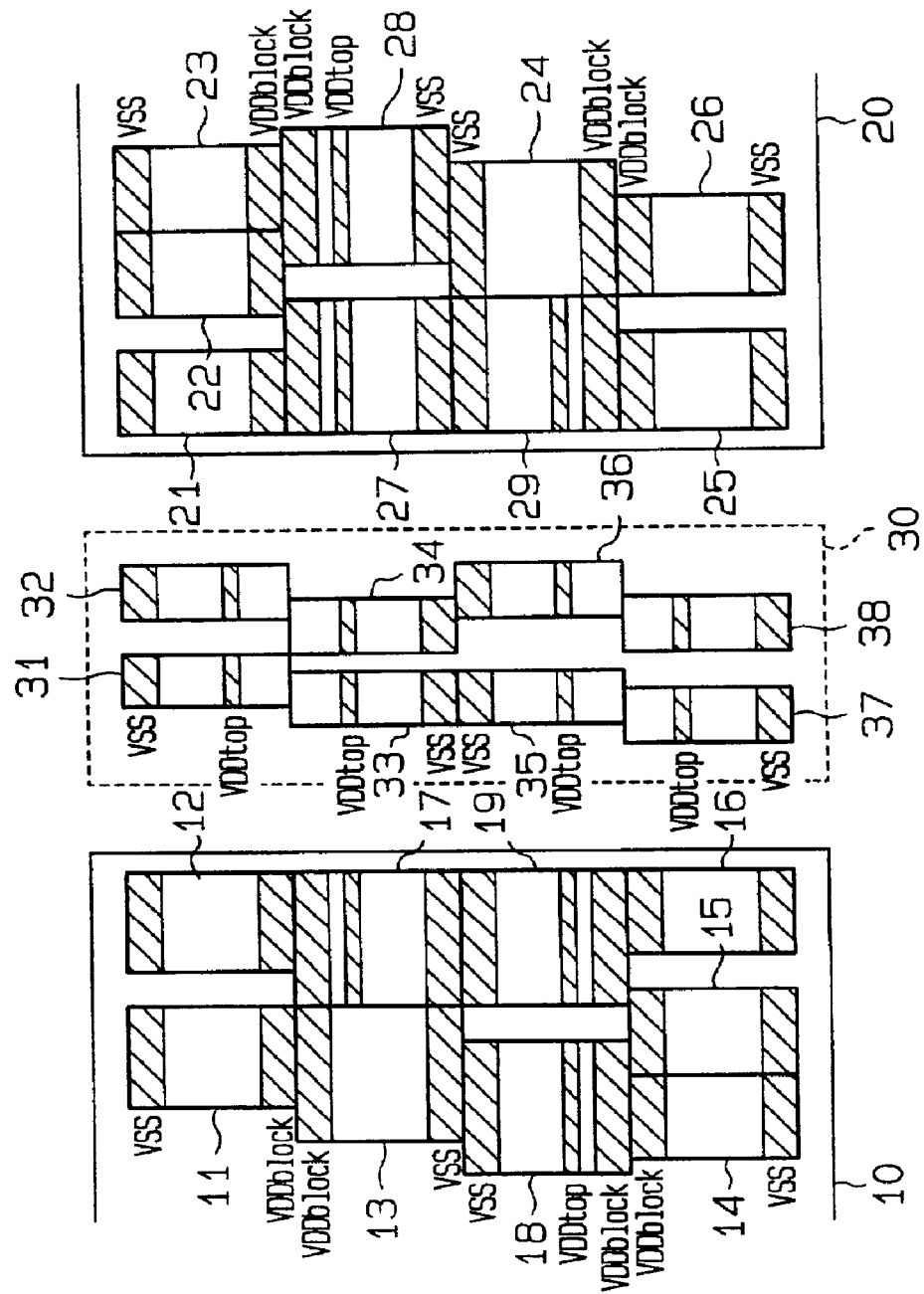
FIG. 7 is a multiple power supply layout diagram showing an example of the arrangement of level converter cells in the first embodiment.

FIG. 7 is a diagram showing the multiple power supply layout of function blocks 10, 20, which include the cells 7, 8, 9 of FIGS. 6A, 6B, 6C.

The function block 10 includes six internal standard cells 11, 12, 13, 14, 15, 16 (which are identical to the internal standard cell 7 of FIG. 6A) and three level converter cells 17, 18, 19 (which are identical to the level converter cell 9 of FIG. 6B). In the internal standard cells 11, 12 and the level converter cells 18, 19, the power supply terminals VSS are formed on the upper ends. In the internal standard cells 13, 14, 15, 16 and the level converter cell 17, the power supply terminals VSS are arranged at the lower ends. In other words, the internal standard cells 11, 12 and the level converter cells 18, 19 are arranged in a state rotated by 180 degrees with respect to the internal standard cells 13, 14, 15, 16 and the level converter cell 17.

The function block 20 includes six internal standard cells 21, 22, 23, 24, 25, 26 and three level converter cells 27, 28, 29. In the internal standard cells 21, 22, 23, 24 and the level converter cell 29, the power supply terminals VSS are arranged at the upper ends. In the internal standard cells 25, 26 and the level converter cells 27, 28, the power supply terminals VSS are arranged at the lower ends. In other words, the internal standard cells 21, 22, 23, 24 and the level converter cell 29 are arranged in a state rotated by 180 degrees with respect to the internal standard cells 25, 26 and the level converter cells 27, 28.

Eight repeater cells 31, 32, 33, 34, 35, 36, 37, 38 (which are identical to the repeater cell 8 of FIG. 6C) are arranged between the function blocks 10, 20. A power supply terminal VSS is arranged at the upper end of each of the repeater cells 31, 32, 35, 36 and the lower end of each of the repeater cells 33, 34, 37, 38.

The cells 11–19, 21–29, and 31–38 form four cell rows in the layout of FIG. 7. More specifically, a first cell row in formed by the cells 11, 12, 31, 32, 21, 22, 23, a second cell row is formed by the cells 13, 17, 33, 34, 27, 28, a third cell row is formed by the cells 18, 19, 35, 36, 29, 24, and a fourth cell row is formed by the cells 14, 15, 16, 37, 38, 25, 26. In each cell row, the same type of power supply terminals VDDblock, VSS, and VDDtop are arranged along the same hypothetical line.

Figure 8:
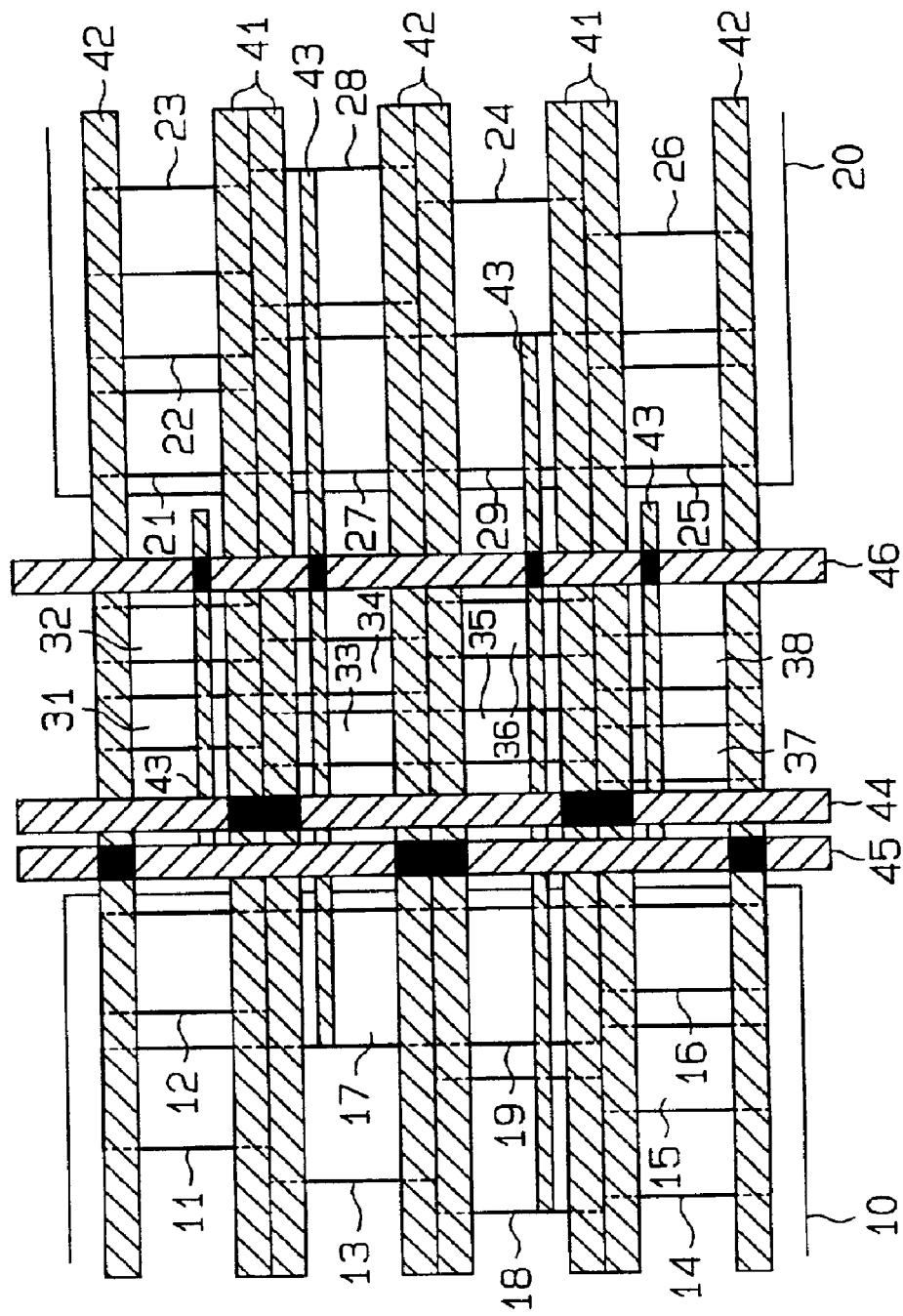
FIG. 8 is a multiple power supply layout diagram of the semiconductor device of the first embodiment.

FIG. 8 shows a semiconductor device having power supply lines connected to the cell layout of FIG. 7. The power supply voltage of the function blocks 10, 20 is 1.0V, the voltage between the function blocks 10, 20, or the power supply voltage of the repeater cells 31–38, is 1.2V.

Since the power supply voltage of the function block 10 is equal to that of the function block 20, a power supply line 41 connects the power supply terminals VDDblock of the internal standard cell 13 and the level converter cell 17 in the function block 10 to the power supply terminals VDDblock of the level converter cells 27, 28 in the function block 20. Further, a power supply line 42 connects the power supply terminals VSS of the internal standard cell 13 and the level converter cell 17 in the function block 10, the power supply terminals VSS of the level converter cells 27, 28 in the function block 20, and the power supply terminals VSS of the repeater cells 33, 34. A power supply line 43 connects the power supply terminal VDDtop of the level converter cell 17 in the function block 10, the power supply terminals VDDtop of the level converter cell 27, 28 in the function block 20, and the power supply terminals VDDtop in the repeater cells 33, 34. In the same manner, the power supply terminals VDDblock, VSS, VDDtop of cells that are arranged along the same cell row are connected by the power supply lines 41, 42, 43, respectively.

A main power supply line 44 is connected to the power supply lines 41 to supply the power supply lines 41 with power. A main power supply line 45 is connected to the power supply lines 42 to supply the power supply lines 42 with power. A main power supply line 46 is connected to the power supply lines 43 to supply the power supply lines 43 with power.

Accordingly, the power supply lines 41, 42, 43 respectively supply the power supply terminals VDDblock, VSS, and VDDtop of the cells arranged along the same cell row with the same power. Since the power supply voltages of the function blocks 10, 20 are the same, the function blocks 10, 20 are connected with the same power supply lines 41, 42. The level converters 17–19 and 27–29 may be arranged outside the function blocks 10, 20.

Figure 9:
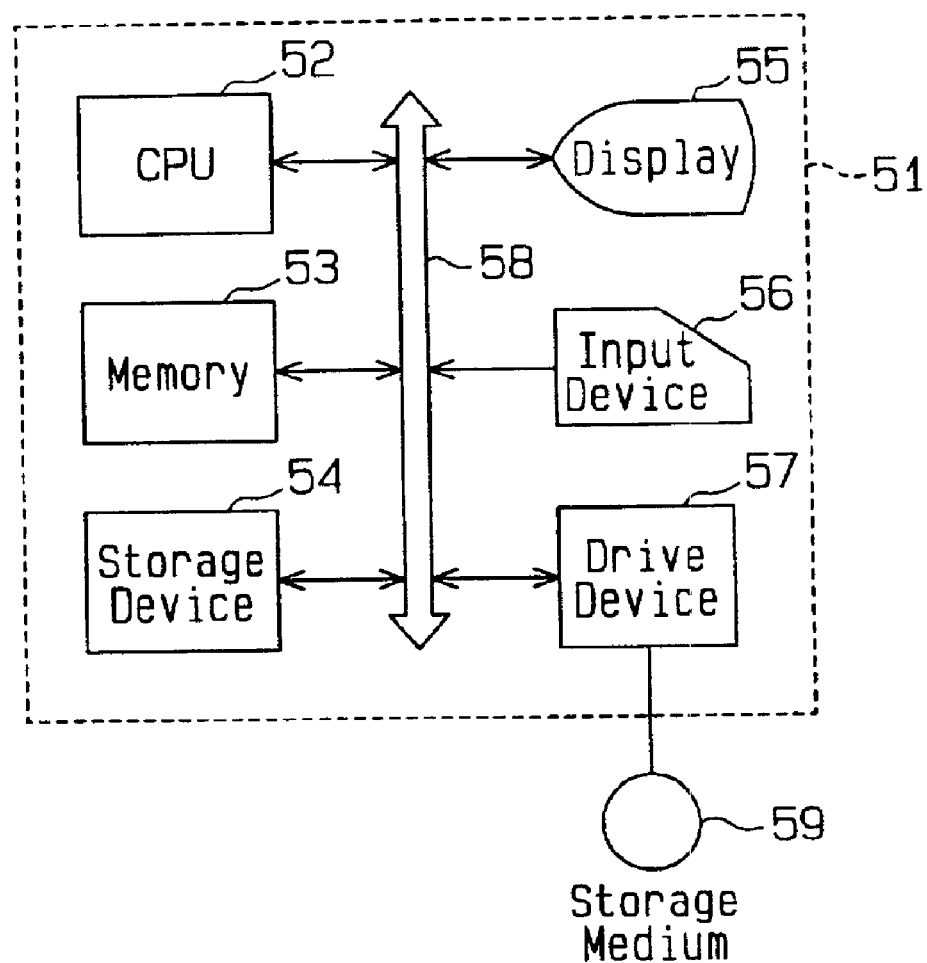
FIG. 9 is a schematic diagram showing a layout data designing system in the first embodiment.

A computer system 51 that performs a method for designing the multiple power supply semiconductor according to the present invention will now be discussed with reference to FIG. 9.

The computer system 51 is, for example, a computer aided design (CAD) apparatus, and includes a central processing unit (CPU) 52, a memory 53, a storage device 54, a display 55, an input device 56, and a disc drive device 57. A bus 58 connects the CPU 52, the memory 53, the storage device 54, the display 55, the input device 56, and the disc drive device 57 to one another.

The CPU 52 reads from the storage device 54 data of programs for performing processes such as the designing of multiple power supply semiconductor devices, delay calculations, and power consumption calculations. Then, the CPU 52 temporarily stores the program data in the memory 53 and executes the programs. The memory 53 includes a cache memory, a system memory, and a display memory (none are shown).

The display 55, which includes a cathode ray tube (CRT), a liquid crystal display (LCD), and a plasma display panel (PDP), displays a semiconductor device layout image and a parameter input image. An operator uses the input device 56, which includes a keyboard and a mouse, to input various instructions and parameters.

Figure 10:
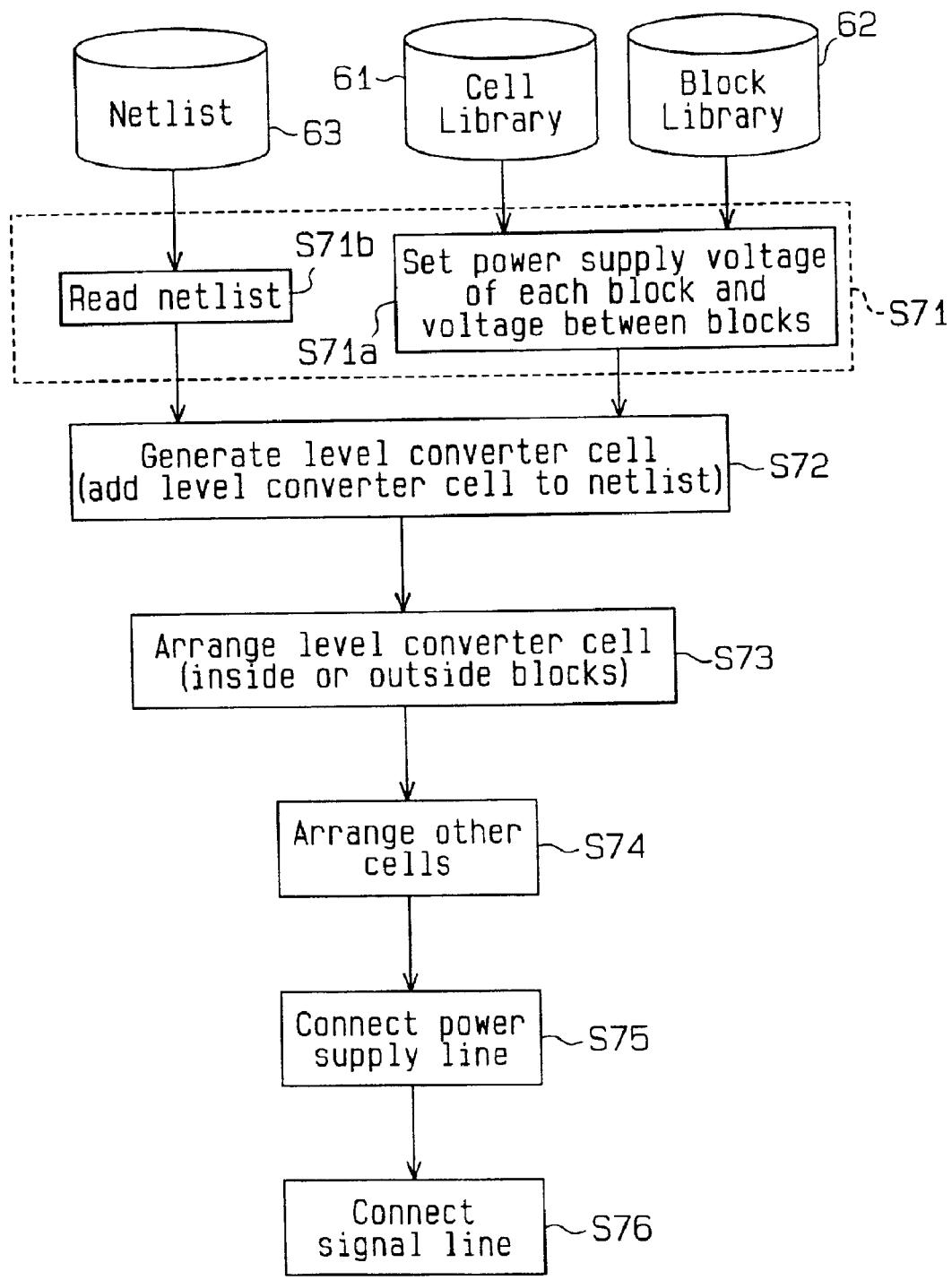
FIG. 10 is a flowchart showing a designing process in the first embodiment.

The storage device 54 includes a magnetic disk device, an optical disc device, and a magneto-optical device. FIG. 10 illustrates a process for designing a multiple power supply semiconductor device. To perform the designing process, first to third data files 61, 62, 63 and program data (steps S71 to S76) are stored in the storage device 54. In response to an instruction from the input device 56, the CPU 52 transfers the program data from the storage device 54 to the memory 53 and executes the program.

A storage medium 59 stores program data. The drive device 57 reads the program data recorded on the storage medium 59. The CPU 52 then installs the read program data in the storage device 54.

The storage medium 59 includes a computer readable storage medium, such as a magnetic tape (MT), a memory card, a floppy disc, an optical disc (e.g., CD-ROM, DVD-ROM), or an optical disc (e.g., CD-ROM, DVD-ROM). The CPU 52 loads program data from the storage medium 59 to the memory 53 when necessary.

The storage medium 59 includes a medium and disc device that record the program data received via a communication medium. Further, the storage medium 59 not only includes a storage medium that records programs directly executed by a computer but also includes a storage medium, such as a hard disk, that installs encoded or compressed programs from a further storage medium for execution by a computer.

The multiple power supply designing process will now be discussed with reference to the flowchart of FIG. 10. The multiple power supply designing process includes steps S71 to S76, and step S71 includes sub-steps S71a, S71b.

The first data file 61 stores a cell library that defines cells operated by a plurality of power supplies. The second data file 62 stores a block library that defines blocks operated by a plurality of power supplies. The third data file 63 stores a netlist of a semiconductor device that is generated from the block library.

In step S71a, the CPU 52 refers to the first and second data files 61, 62 to set the power supply voltage of each function block and the voltage between the blocks.

In step S71b, the CPU 52 reads the third data file 63 from the netlist.

In step S72, the CPU 52 generates level converter cells based on the set function block power supply voltage and the voltage between the blocks. The CPU 52 then adds the generated level converter cells to the netlist.

In step S73, the CPU 52 arranges the level converter cells inside or outside function blocks having power supply voltages differing from the voltage between the blocks.

In step S74, the CPU 52 arranges the other cells (e.g., internal standard cells and repeater cells) in the function blocks. In step S75, the CPU 52 determines the layout of a power supply lines that connect the power supply terminals of the level converter cells, the internal standard cells, and the repeater cells. At step S76, the CPU 52 connects signal lines to each of the cells.

The first embodiment has the advantages described below.

(1) The repeater cells 31–38 are arranged between the function blocks 10, 20. The row in which the power supply terminals VDDblock of the internal standard cells 11–16, 21–26 lie differs from the row in which the power supply terminals VDDtop of the repeater cells 31–38 lie. Each of the level converter cells 17–19, 27–29 has power supply terminals VDDblock, VDDtop, which are formed integrally with the cells 17–19, 27–29. The same type of power supply terminals VDDblock, VSS, VDDtop are respectively connected by the linear power supply lines 41, 42, 43. This structure enables cells having different power supply voltages to be arranged along the same cell row. Thus, the power supply layout is simple and the connection of the power supply lines is facilitated.

(2) The row of the power supply terminals VDDblock differs from the row of the power supply terminals VDDtop. Thus, when arranging additional repeater cells between blocks (in a wiring net), the designing and layout of the additional repeater cells are facilitated. Accordingly, the designing of the semiconductor device is performed efficiently.

(3) By arranging the level converter cells 17–19, 27–29 in the function blocks 10, 20, only the repeater cells 31–38 are arranged between the function blocks 10, 20. This forms unified power supply voltages between the blocks. This simplifies the connection of power supply lines to various types of cells and facilitates the designing of the semiconductor device.

(4) Each of the level converter cells 17–19 and 27–29 are formed integrally. This simplifies the layout designing of the multiple power supply semiconductor device.

(5) The program data stored in the storage medium 59 may be installed in a conventional CAD system. Accordingly, the designing method according to the present invention designs a multiple power supply semiconductor device within a short period of time with a CAD system. Further, the preparation or purchase of a new designing apparatus is not necessary.

A semiconductor device according to a second embodiment of the present invention will now be discussed with reference to FIG. 11.

In the semiconductor device of the second embodiment, the power supply voltage of the function block 10 differs from that of the function block 20. The remaining structure is substantially the same as the first embodiment.

Figure 11:
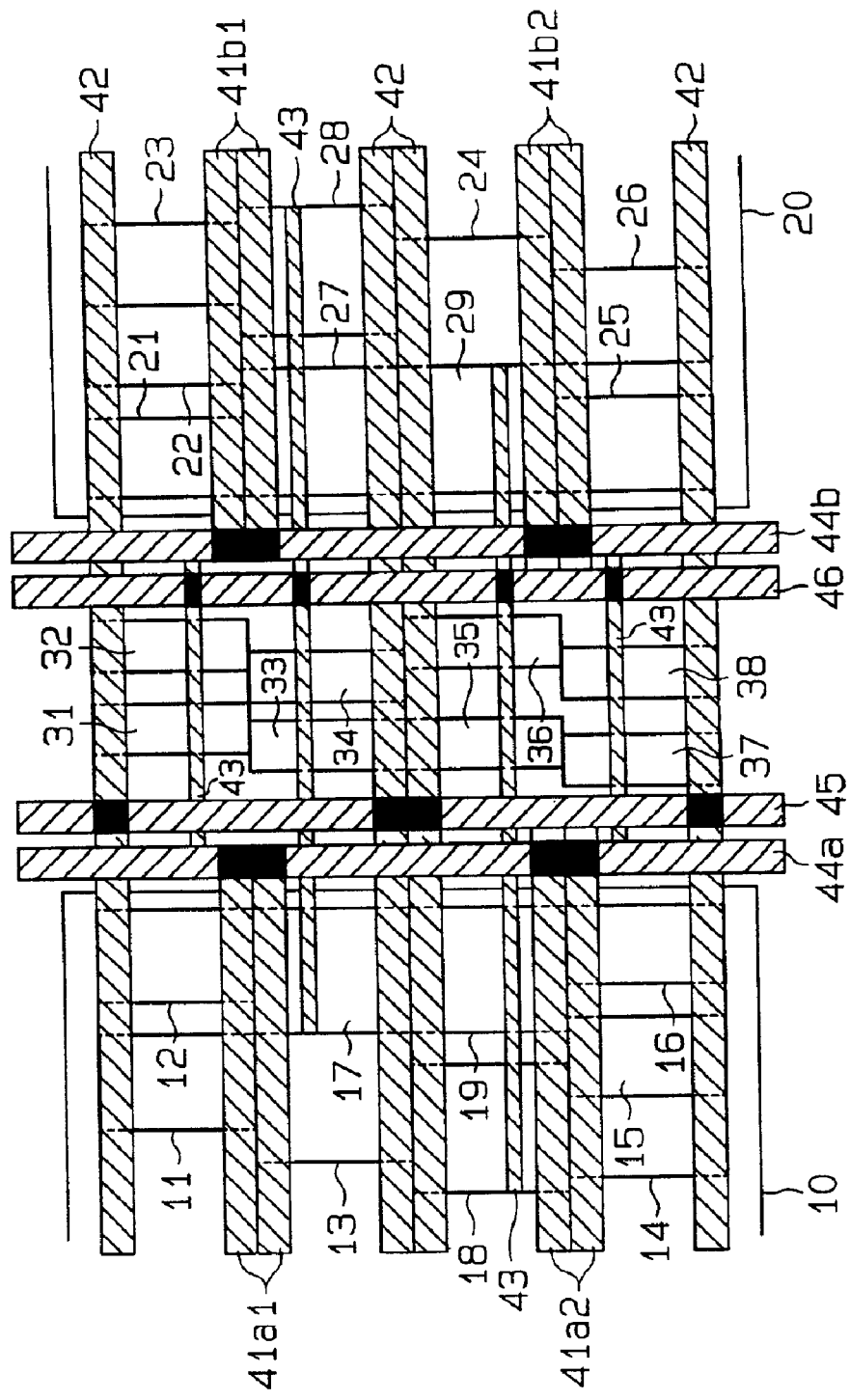
FIG. 11 is a multiple power supply layout diagram of a semiconductor device according to a second embodiment of the present invention.

With reference to FIG. 11, the power supply voltage of the function block 10 is 0.8V, and the power supply voltage of the function block 20 is 1.0V. The power supply voltage between the function blocks 10, 20, or the repeater cell power supply voltage, is 1.2V.

In the function block 10, power supply lines 41$a$1 connect the power supply terminals VDDblock of the internal standard cells 11, 12, 13 and the level converter cell 17. In the function block 20, power supply lines 41$b$1 connect the power supply terminals VDDblock of the internal standard cells 21, 22, 23 and the level converter cells 27, 28.

Further, in the function block 10, power supply lines 41$a$2 connect the power supply terminals VDDblock of the internal standard cells 14, 15, 16 and the level converter cells 18, 19. In the function block 20, power supply lines 41$b$2 connect the power supply terminals VDDblock of the internal standard cells 24, 25, 26 and the level converter cell 29.

A main power supply line 44$a$ is connected to the power supply lines 41$a$1, 41$a$2 to supply the power supply lines 41$a$1, 41$a$2 with power. A main power supply line 44$b$ is connected to the power supply lines 41$b$1, 41$b$2 to supply the power supply lines 41$b$1, 41$b$2 with power.

The power supply terminals VSS, VDDtop of the standard cells 11–16, 21–26, the level converter cells 17–19, 27–29, and the repeater cells 31–38 in the function blocks 10, 20 are connected by the power supply lines 42, 43 in the same manner as in the first embodiment. The main power supply lines 45, 46, connect the power supply lines 42, 43, respectively.

As described above, when the power supply voltages of the function blocks 10, 20 differ, the power supply lines 41$a$1, 41$a$2 that connect the power supply terminals VDDblock of the cells in the function block 10 are provided separately from the power supply lines 41$b$1, 41$b$2 that connect the power supply terminals VDDblock of the cells in the function block 20.

The second embodiment has the same advantages as the first embodiment.

The first and second embodiments may be modified as described below.

The power supply lines 41 of FIG. 8 may be separated in the same manner as the power supply lines 41$a$1, 41$a$2, 41$b$1, 41$b$2 of FIG. 11.

Figure 12:
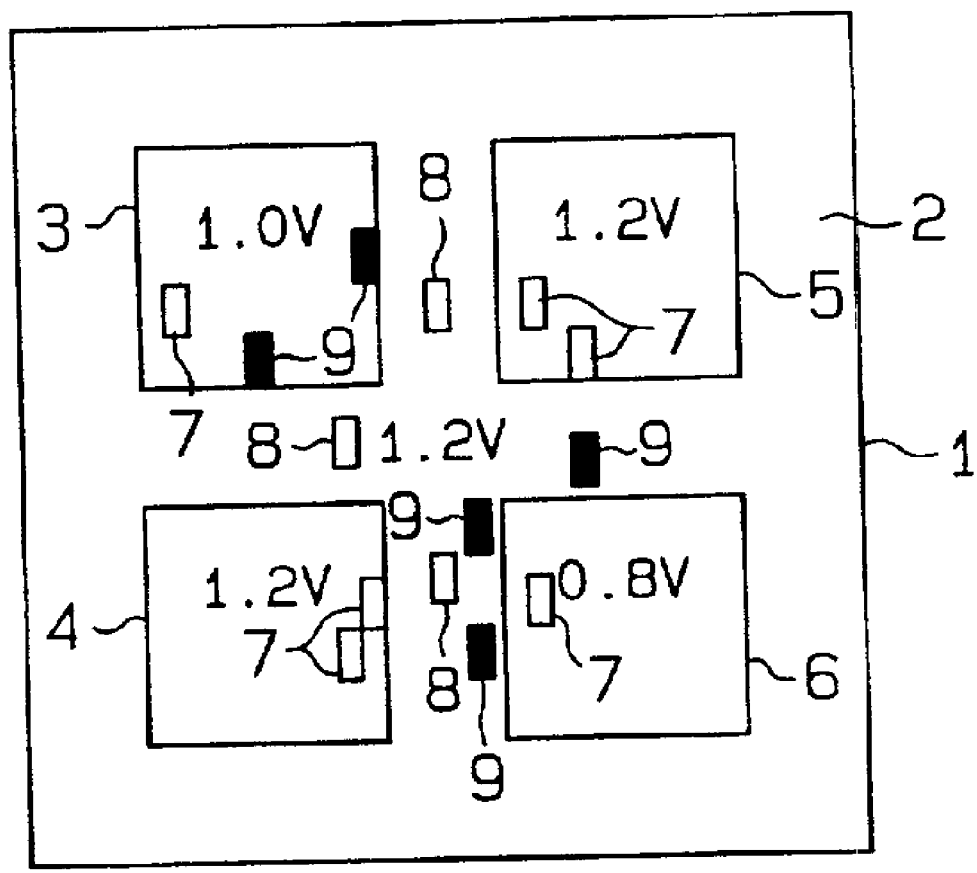
FIG. 12 is a multiple power supply layout diagram of a semiconductor device according to a further embodiment of the present invention.

In the first embodiment, the level converter cells 17–19, 27–29 do not have to be arranged near the periphery of the function blocks 10, 20. For example, referring to FIG. 12, at least one of the level converter cells 9 may be arranged between the function blocks 3, 4, 5, 6 and near the associated one of the function blocks 6.

When the power supply voltages of the function blocks 10, 20 are the same, the repeater cells 31–38 arranged between the function blocks 10, 20 may be eliminated. Further, the level converter cells 17–19, 27–29 may be eliminated.

In the first and second embodiments, the semiconductor device 1 may have a third function block 30 (as shown by the broken lines in FIG. 7) located between the function blocks 10, 20. In this case, the repeater cells 31–38 are arranged in the third function block 30.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A semiconductor device comprising:
   a plurality of blocks including a first block and a second block;
   a plurality of first standard cells, wherein at least one of the first standard cells is arranged in the first block and at least one of the first standard cells is arranged in the second block, each of the first standard cells having a first power supply terminal;
   a second standard cell arranged between the first and second blocks, wherein the second standard cell has a second power supply terminal misaligned with the first power supply terminal; and
   at least one level converter cell aligned with the first and second standard cells and having a third power supply terminal aligned with the first power supply terminal and a fourth power supply terminal aligned with the second power supply terminal.

2. The semiconductor device according to claim 1, wherein the first power supply line is linear and connects the first and third power supply terminals.

3. The semiconductor device according to claim 1, wherein the second power supply line is linear and connects the second and fourth power supply terminals.

4. The semiconductor device according to claim 1, wherein the second standard cell is arranged outside the plurality of blocks.

5. The semiconductor device according to claim 1, wherein the level converter cell is arranged in the plurality of blocks.

6. The semiconductor device according to claim 1, wherein the plurality of blocks is a plurality of function blocks, wherein the second standard cell is arranged between the plurality of function blocks.

7. The semiconductor device according to claim 1, wherein the plurality of blocks is a plurality of function blocks, wherein the first standard cell and the level converter cell are arranged in each of the function blocks.

8. The semiconductor device according to claim 1, further comprising a third block arranged between the first and second blocks, wherein the second standard cell is arranged in the third block.

9. The semiconductor device according to claim 1, wherein the at least one level converter cell is arranged in at least one of the first and second blocks.

10. The semiconductor device according to claim 1, wherein the at least one level converter cell is arranged between the first and second blocks.

11. The semiconductor device according to claim 1, further comprising:
a first power supply line connected to the first power supply terminal of each of the first standard cells arranged in the first and second blocks; and
a second power supply line connected to the second power supply terminal of the second standard cell.

12. The semiconductor device according to claim 1, further comprising:
a first power supply line connected to the first power supply terminal of the first standard cell arranged in the first block;
a second power supply line connected to the first power supply terminal of the first standard cell arranged in the second block; and
a third power supply line connected to the second power supply terminal of the second standard cell.

13. The semiconductor device according to claim 1, further comprising a linear first power supply line connected to the first power supply terminal of at least one of the plurality of first standard cells and to the third power supply terminal of the at least one level converter cell.

14. The semiconductor device according to claim 1, further comprising a linear second power supply line connected to the second power supply terminal of the second standard cell and the fourth power supply terminal of the at least one level converter cell.

15. A designing apparatus for generating layout data of a semiconductor device, wherein the semiconductor device is provided with a plurality of blocks including a first block and a second block, a plurality of first standard cells arranged in the first and second blocks, a second standard cell arranged between the first and second blocks, and at least one level converter cell, the plurality of first standard cells, the second standard cell, and the level converter cell each having an end, a first region separated from the end by a predetermined first distance, and a second region separated from the end by a predetermined second distance, wherein each of the first standard cells have a first power supply terminal formed in the first region, the second standard cell has a second power supply terminal formed in the second region, and the level converter cell has a third power supply terminal formed in the first region and a fourth power supply terminal formed in the second region, the designing apparatus comprising:
a processor, wherein the processor obtains netlist data of the semiconductor device, sets a power supply voltage of each of the blocks based on the netlist data, sets a voltage between the blocks based on the power supply voltage of each block, generates the level converter cell based on the voltage between the blocks, and arranges the level converter cell in one of locations in or between the blocks in accordance with the power supply voltage and the voltage between the blocks so as to align the level converter cell with the first and second standard cells.

16. The designing apparatus according to claim 15, wherein the processor arranges the level converter cell in a block having a power supply voltage that differs from the voltage between the blocks.

17. The designing apparatus according to claim 15, wherein the processor further aligns the first and second standard cells with the level converter cell.

18. A computer readable storage medium storing a program for generating layout data of a semiconductor device having a plurality of blocks with a computer, wherein the semiconductor device is provided with a plurality of blocks including a first block and a second block, a plurality of first standard cells arranged in the first and second blocks, a second standard cell arranged between the first and second blocks, and at least one level converter cell, the plurality of first standard cells, the second standard cell, and the level converter cell each having an end, a first region separated from the end by a predetermined first distance, and a second region separated from the end by a predetermined second distance, wherein each of the first standard cells have a first power supply terminal formed in the first region, the second standard cell has a second power supply terminal formed in the second region, and the at least one level converter cell has a third power supply terminal formed in the first region and a fourth power supply terminal formed in the second region, the program comprising the steps of:
obtaining netlist data of the semiconductor device with the semiconductor device;
setting a power supply voltage of each of the blocks based on the netlist data;
setting a voltage between the blocks based on the power supply voltage of each block;
generating the level converter cell based on the voltage between the blocks; and
arranging the level converter cell in one of locations in or between the blocks in accordance with the power supply voltage and the voltage between the blocks so as to align the level converter cell with the first and second standard cells.

19. A semiconductor device comprising:
a linear first power supply line for supplying a first power supply voltage;
a linear second power supply line extending parallel to the first power supply line for supplying a second power supply voltage that differs from the first power supply voltage;
a first block;
a second block;
a plurality of first standard cells arranged in each of the first and second blocks, wherein each of the plurality of first standard cells has a predetermined shape and includes an end and a first power supply terminal formed at a location separated from the end by a predetermined first distance, the first power supply terminal being connected to the first power supply line;

a second standard cell having substantially the same shape as the first standard cells and including an end and a second power supply terminal formed at a location separated from the end by a predetermined second distance that differs from the first distance, the second power supply terminal being connected to the second power supply line; and a level converter cell aligned with the first and second standard cells, wherein the level converter cell has substantially the same shape as the first and second standard cells and includes an end, a third power supply terminal formed at a location separated from the end by the first distance and connected to the first power supply line, and a fourth power supply terminal formed at a location separated from the end by the second distance and connected to the second power supply line.

* * * * *